United States Patent [19] [11] 4,270,144
Hartman et al. [45] May 26, 1981

[54] CHARGE COUPLED DEVICE WITH HIGH SPEED INPUT AND OUTPUT

[75] Inventors: John M. Hartman; Arthur L. Lancaster, both of Costa Mesa, Calif.

[73] Assignee: Hughes Aircraft Company, Culver City, Calif.

[21] Appl. No.: 803,109

[22] Filed: Jun. 3, 1977

Related U.S. Application Data

[63] Continuation of Ser. No. 657,516, Feb. 12, 1976, which is a continuation of Ser. No. 510,108, Sep. 27, 1974.

[51] Int. Cl.³ .................... G11C 19/28; H01L 29/78
[52] U.S. Cl. .................................. 307/221 D; 357/24
[58] Field of Search ....................... 357/24; 307/221 D

[56] References Cited

U.S. PATENT DOCUMENTS

| | | | |
|---|---|---|---|
| 3,806,772 | 4/1974 | Early | 357/24 |
| 3,811,055 | 5/1974 | Weimer | 357/24 |
| 3,906,359 | 9/1975 | Blaha et al. | 357/24 |
| 3,913,077 | 10/1975 | Erb | 357/24 |
| 3,919,564 | 11/1975 | Walden | 357/24 |
| 3,930,255 | 12/1975 | Means | 357/24 |
| 3,934,261 | 1/1976 | Sequin | 357/24 |
| 4,010,485 | 3/1977 | Sauer | 357/24 |

OTHER PUBLICATIONS

Sequin "Two-Dimensional Charge Transfer Arrays", IEEE J. Solid-State Circuits, vol. SC-9 (6/74), pp. 134-142.
Chang et al., "Charge Coupled Device Magnetic Field Sensor", IBM Tech. Disclosure Bulletin, vol. 14 (4/72), p. 3420.
Tartamella "Control-Charged Device Shift Register", IBM Tech. Disclosure Bulletin, vol. 15 (10/72), p. 1461.

Primary Examiner—Gene M. Munson
Attorney, Agent, or Firm—Joseph E. Szabo; William H. MacAllister

[57] ABSTRACT

Various techniques for merging charge into and splitting charge from CCD's are described. Specifically disclosed in detail is a racetrack shaped charge coupled device (CCD), provided with special input and output stations operating on the principle of progressive charge read in and readout. During read in (which is a special case of charge merging), charge is injected in the direction of prevailing charge flow in the main channel of the CCD, with the injected charge packets being transferred laterally into the main charge stream while being stepped forward in the channel. During readout (which is a special case of charge splitting), charge is transferred from the main channel to an auxiliary channel through a plurality of interconnecting ports and, as during read in, transfer of a given charge packet takes place over a time period during which the charge packet is stepped forward in the main channel through several storage sites.

1 Claim, 25 Drawing Figures

CHARGE COUPLED DEVICE WITH HIGH SPEED INPUT AND OUTPUT

This is a continuation application of pending prior application Ser. No. 657,516 filed on Feb. 12, 1976, which is itself a continuation of prior application Ser. No. 510,108 filed on Sept. 27, 1974.

BACKGROUND OF THE INVENTION

The present invention generally relates to charge coupled devices (CCD's) and particularly those which are to be operated at high frequencies as shift registers.

Devices of the above type are characterized by a semiconducting substrate in which a relatively long and narrow channel is defined by a channel stopping doped region. Spanning, or bridging, the channel is a plurality of slender electrodes to which clock pulses are applied in sequence to cause an injected packet of charge to be stepped along the channel to successive storage sites created by the electrodes in the substrate within the channel. In injecting and extracting charge to and from such a CCD it has been customary to make the charge move directly toward or away from a given electrode through an inlet or outlet port in the side of the channel. This is particularly true in the case of a so called Racetrack CCD in which the main charge carrying channel has no end, so that read in and readout must, of necessity, occur through the side of the channel. Since the electrodes are much longer than they are wide, a charge which is being injected or extracted must traverse a much greater distance than one which is simply being stepped forward. As a result, the operating frequency of the CCD is greatly diminished by the need to accomodate the time required for charge read in and readout.

The reading of charge into or out of a CCD are but two applications of a broader concept of the present invention, which is the merging and splitting of charge. In the case of merging, charges progressing in an auxiliary channel are merged into charges flowing along a main channel of a CCD. The charge flowing in the auxiliary channel can be thought of as an input to the charges which flow in the main channel.

Similarly, in the case of charge splitting, charges which flow in a main channel are split off at a junction into charges which flow along the main channel and charges which are diverted to flow along the auxiliary channel. The "length of charge transfer time" problem caused by the electrode length/width ratio is present when merging or splitting is attempted.

It is, therefore, a general object of the present invention to provide charge merging and splitting junctions which do not slow down the operation of the CCD's with which they are used.

Another general object of the present invention is to increase the operating frequency of CCD shift registers. It is a more specific object of the invention to provide an input and an output for a CCD which does not significantly limit its operating speed.

As applied to the reading of information into a CCD, it is an object of the invention to provide an input station for a CCD through which a charge packet can be injected into the CCD in such a manner that, although the charge packet is injected into the CCD in a brief time period, it is progressively transferred into and stored by the CCD over several succeeding time periods.

Similarly, as applied to the reading of information from a CCD, it is a specific object of the invention to provide an output structure which is capable of receiving and accumulating over several successive time periods a charge packet which is to be read out during a subsequent single time period.

The charge-splitting junction of the present invention basically comprises a main charge-carrying channel defined in the surface of a semiconducting substrate by a pair of channel-stopping walls, one of which has a discontinuity along a predetermined portion thereof to permit charge to flow from the channel, and an auxiliary channel extending next to the main channel and communicating therewith through the discontinuity so as to receive charge flowing therethrough. The discontinuity through which the channels communicate may be either a single opening whose length is on the same order as is the width of the channels, or it may comprise a series of short spaced-apart openings whose width is a fraction of the widths of the channels.

An electrode array extends across both channels through the discontinuity so as to successively step along the main channel, and past the discontinuity, a first charge which is to be split, while concurrently stepping along the auxiliary channel a second charge which has been split from the first charge. As a result, the first charge will flow progressively along the electrode array from the main channel to the auxiliary channel as that charge is successively stepped along the main channel by the electrode array.

The charge-merging junction of the present invention operates on the same principle as the charge-splitting junction just described. It, too, is comprised of a main charge-carrying channel and an auxiliary channel intercommunicating through a discontinuity which is in a common wall between them and which may be either a single opening or a plurality of shorter openings. By the provision of an electrode array, extending across both of the channels through the discontinuity for stepping the charges along the main and auxiliary channels in tandem past the discontinuity, charge being stepped along the auxiliary channel may be caused progressively to flow along the electrode array through the discontinuity into the main channel as the charges in both channels are being successively stepped past the discontinuity.

As applied to a CCD having a semiconducting substrate, with means within the substrate defining a charge-carrying channel in which a series of storage sites are defined when an array of electrode structures distributed on the surface of the substrate are electrically energized with clocking signals applied to the electrode structures to step charge packets along the channel between successive ones of the storage sites, the objects of the present invention are attained by the provision of an improved read in station comprising means within the substrate defining a charge inlet chamber communicating with an enlarged section of the charge-carrying channel through an interconnecting port and by the combination with the charge inlet chamber of means whereby charge packets may be injected from the chamber through the port into the enlarged section of the channel in the direction of charge flow therein synchronously with the clocking signals which are being applied to the electrode structures.

In further keeping with the present invention, additional objects of the invention are attained in a CCD of the type just recited by the provision of an improved readout station featuring an auxiliary charge-carrying channel in the substrate next to the main charge-carrying channel, with the auxiliary channel communicating with the main channel throgh a series of connecting channels (hereinafter referred to in this specification as "transfer ports") in the substrate. The electrode structures which are distributed on the surface of the substrate, to define storage sites along the channel, terminate over the transfer ports, as do a second set of electrode structures, which extend across the auxiliary charge-carrying channel. Readout is effected by the provision of means for causing charge to flow from the main channel to the auxiliary channel through the transfer ports and by the further provision of means for stepping charge packets in tandem along both the main and auxiliary charge-carrying channels so that, during readout, a given charge packet is cumulatively transferred, at least in part, from the main channel to the auxiliary channel as the charge packet passes successive ones of the transfer ports.

Although most useful for reading (or splitting) charges out of a CCD, the multi-transfer port configuration may also be used for reading (or merging) charges into a CCD. The combination of both the improved readout and read in stations in a single CCD is to be preferred, since it results in the attainment of the largest number of the objectives of the present invention. However, either may be used without the other in specific circumstances.

Further objects, features, and advantages of the invention will become more apparent from the following specification and drawings in which:

Figure 1:
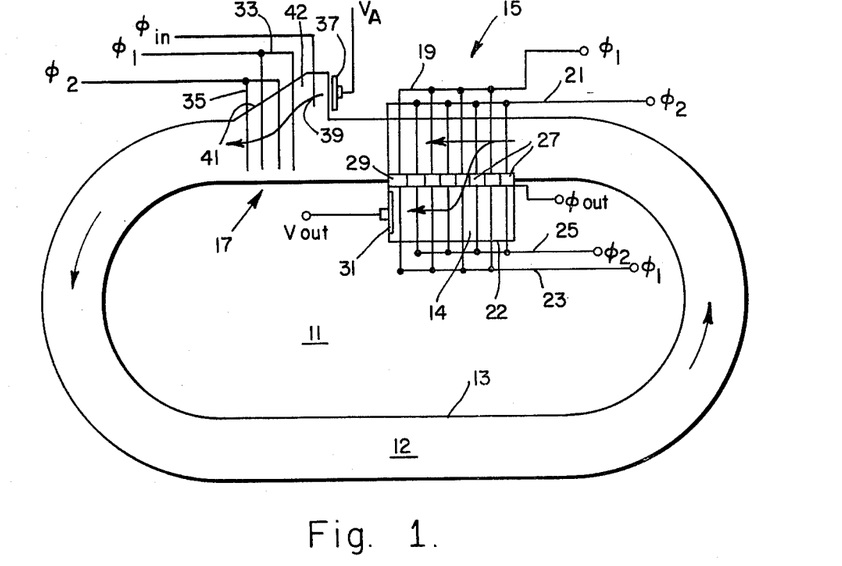
FIG. 1 is a general system layout diagram of a racetrack CCD with input and output ramps incorporating features of the present invention.

A CCD incorporating features of the invention is illustrated generally in FIG. 1. It should be understood that a "racetrack" CCD is shown for purposes of illustration only and that the input and output devices of the present invention may also be used with CCD's which extend generally in a straight line. It should also be appreciated in following this description that the actual device illustrated herein is much smaller than is likely to be imagined by the reader. The entire device illustrated in FIG. 1, for example, is typically on the order of 0.2" or less in length.

The illustrated device is typically formed in a chip of silicon in which diffusions are formed to define a main channel 12 in which charges are to circulate. In the exemplary device of FIG. 1 the main channel 12 is oval in shape and hence the name "racetrack" given to the exemplary system. Situated at the top of the system 11 are a readout station 15 and a read in station 17. Charge is assumed to circulate counterclockwise, so that charge injected through the read in station 17 may be read out by means of readout station 15 after making one trip or more around the channel 12.

The readout station 15 is comprised basically of two main regions. The first is that portion of the main channel 12 which runs through the readout station. The second portion is an auxiliary channel 14 which runs parallel to the main channel 12, being defined by an additional channel stopper 22. As will be seen in subsequent figures, the exemplary racetrack CCD is of the two-phase type, having two principal sets of electrode structures, one for each phase, running along its width, with phase 1 electrode structures alternating with phase 2 electrode structures. These phase 1 and phase 2 electrode structures continue through the main channel portion of the output station 15 and are illustrated therein as the alternate sets of electrode structures 19 and 21, respectively. A corresponding set of electrode structures 23 and 25 extend over the auxiliary channel of the output station, so that the phase 1 electrode structures of the main and auxiliary channels are in alignment, as are the phase 2 electrode structures of those channels.

In order to provide a path for the transfer of charge to be read out from the main channel 12 to the auxiliary channel 14, a plurality of transfer ports 27 are provided between the two channels. These transfer ports serve to permit the individual transfer of charge temporarily stored under given ones of the electrode structures 19 and 21 to the corresponding electrode structures 23 and 25 of the output, or auxiliary channel 14. A transfer electrode 29, extending over the ports 27, serves to permit such a transfer to occur when readout is desired. Generally, in accordance with the invention, a given charge packet is read out by stepping it through the main channel 12 in the output station 15 and by causing it to flow bit by bit from the main channel 12 to the auxiliary channel 14 as it is being stepped along the main channel so that, by the time the charge packet reaches the last of the electrodes 19 and 21, it will have been transferred substantially in its entirety through the transfer ports 27 to the auxiliary channel 14 where it is read out by an output structure generally illustrated as a diffusion 31. This gradual transfer of a charge packet, as it progresses through the readout station 15, is further made possible by the application of phase 1 and phase 2 clock voltages to the electrode structures 23 and 25 in phase with the clock voltages which are being applied to the main channel electrodes 19 and 21, thus stepping the portions of the charge packet which have been transferred into the auxiliary channel 14 in tandem with those portions of the charge packet which are still progressing along the main channel, awaiting the remainder of the readout operation.

The read in station 17 is defined by a channel stopper 41, which in the exemplary embodiment provides a generally funnel-shaped inlet to the main channel 12. Charge to be circulated in the main channel 12 is injected through an input diffusion 37 and is transferred through an input electrode structure 39 to phase 1 and phase 2 electrode structures 33 and 35 which correspond in function to the already mentioned phase 1 and phase 2 electrode structures 19 and 21. They differ therefrom only in that they span both the main channel 12 and the additional inlet area defined by the channel stopper 41. When a charge is clocked in through the diffusion 37, it has several clock periods to progress in the auxiliary input area 42 before being guided into the main channel 12 by the sloped configuration of the channel stopper 41. Thus, a charge packet injected during a given clock period has several subsequent clock periods in which it may gradually move into the main channel 12.

Figure 2:
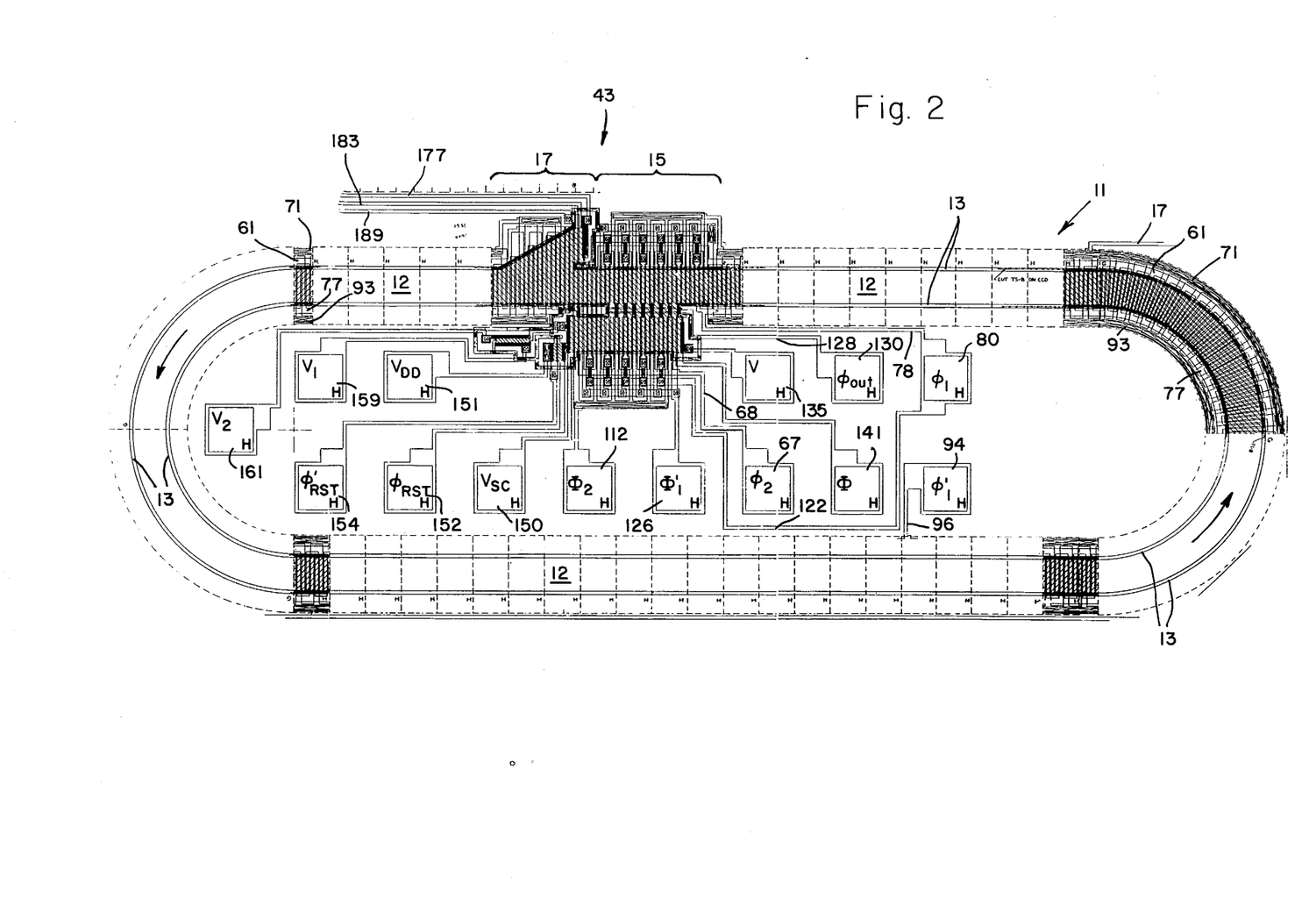
FIG. 2 is a detailed system layout diagram of the racetrack CCD illustrated generally in FIG. 1.
Figure 3:
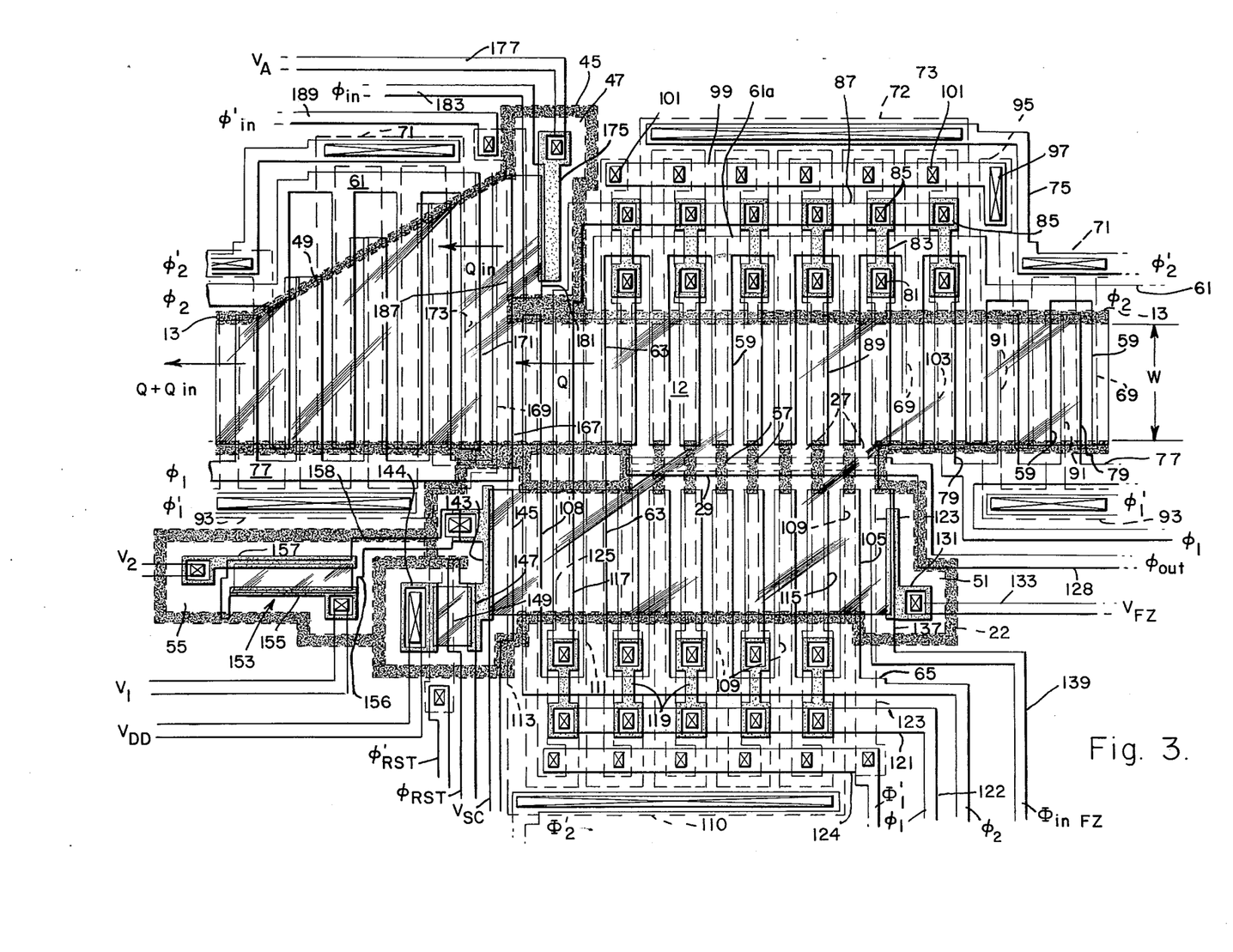
FIG. 3 is a magnified layout diagram of the input ramp and output track portions of the FIG. 2 racetrack CCD.

A more detailed layout of the exemplary CCD illustrated schematically in FIG. 1 appears in FIG. 2. The actual diagram from which FIG. 2 was reproduced is approximately four feet long and is drawn 500 times to scale. Obviously, the details of the full diagram are not visible in FIG. 2. Those portions of FIG. 2, however, which represent the present invention are shown in FIG. 3 essentially on the scale to which the layout diagram was drawn. Referring first to FIG. 2, the readout and read in stations 15 and 17 are seen to be combined into a single input/output station 43, although, as will become apparent as this description proceeds, their operation is quite independent of one another. It will also be noted that the main channel 12, defined by the channel stoppers 13, extends right through the input/output station 43.

Clock voltages to the phase 1 and phase 2 electrode structures are supplied by means of bus lines which run on either side of the main channel 12. These and other voltages are supplied through metal pads which are distributed within the CCD 11. Each pad is identified with the symbol associated with the voltage or signal applied to or received from the CCD 11 through them. Each pad is shown as a signal source or tap in FIG. 6.

Figure 9:
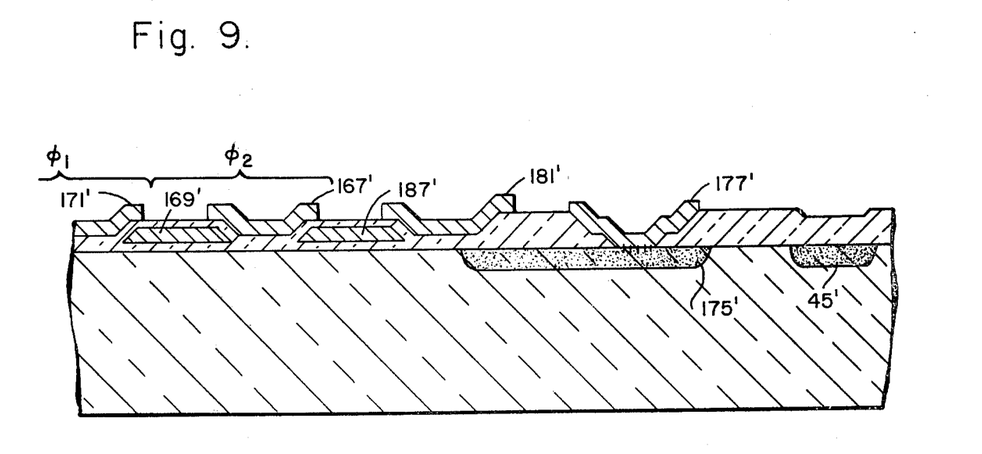
FIG. 9 is a cross-section through FIG. 8 along lines 9—9 to illustrate the electrodes and diffusions of the input ramp.

Each of the phase 2 electrode structures 21 of FIG. 1 comprises two individual electrodes. One of them lies buried in a silicon dioxide layer overlying the silicon chip. The other electrode is formed on the surface of the oxide layer and slightly overlaps the buried electrode. A pair of such electrodes is illustrated in FIG. 9 as the elements 167' and 169'. Similarly, each of the phase 1 electrode structures 19 is comprised of a buried and a surface electrode member. The surface members of the phase 1 electrode structures receive the phase 1 ($\phi$1) clock voltage through bus line 77 while their companion buried members receive the same clock voltage, labelled $\phi$1' over another bus line 93 running just outside the line 77. Similarly, the phase 2 ($\phi$2) clock voltage is applied to the surface ($\phi$2) and buried ($\phi$2') members of the phase 2 electrode structures 21 over bus lines $\phi$2 and $\phi$2' 61 and 71 running just outside the main channel 12. As will be seen in the following discussion of the more detailed diagram of FIG. 3, all four bus lines 61, 71, 77 and 93 have to be re-routed within the read in/readout station 43.

Referring now to FIG. 3, there will first be briefly described the configuration of the input/output station 43 as defined by the channel stopper 13 and various extensions thereof. Turning first to the input station, an input chamber 47 is formed by a short wall portion 45 which extends upwardly from the channel stopper 13. The front of the chamber 47 is an open inlet port enclosed for sole communication with the main channel 12 by a gradually sloping wall portion 49 which extends from one extremity of the inlet port to the channel stopper 13 defining the main channel 12.

The output or auxiliary channel 51 extends parallel to the main channel 12 and, as previously mentioned, communicates with the main channel 12 through a plurality of transfer ports 27 which in FIG. 3 are shown to number eight. The transfer ports are defined by partitions 57 which are short diffusions formed at the same time that the main channel stopper 13 is created.

Charge in the auxiliary channel 51 goes from right to left, as viewed in FIG. 3. A readout structure comprised of doped regions and electrodes is located at the left hand of the auxiliary channel 31 and a chamber 55, housing a MOSFET device, is situated to the immediate left of the channel, again being defined by an extension of the channel stopper 22 which defines the auxiliary channel 51.

Turning next to the electrode structure of the exemplary CCD system, a set of transfer electrodes 79 extends from the $\phi$1 bus 77 across the main channel 12. Interlaced with the $\phi$1 electrodes 79 are a second set of transfer electrodes 59 which extend from the $\phi$2 bus line 61. Each of the transfer electrodes 59 and 79 is a metal strip extending over an oxide layer on top of the semiconducting substrate in which the device is formed and serves to transfer charge between storage electrodes, which are to be described next. The surface electrodes 79 and 59 are better shown in FIG. 9 as the elements 167' and 171'.

Extending from the $\phi$1' bus 93 are a series of buried storage electrodes 91 which are so positioned that the trailing edge of each buried electrode 91 extends under the leading edge of a $\phi$1 transfer electrode 79, while the leading edge of each storage electrode 91 extends under the trailing edge of a $\phi$2 transfer electrode 59. Again, this relationship is best seen by observing the relationship of the buried electrode 169' relative to the $\phi$1 and $\phi$2 transfer electrodes 171' and 167' in FIG. 9. It might be noted that each $\phi$1 buried electrode 91 and its overlying transfer electrode 79 function as a single electrode structure; and, for that reason, the $\phi$1 and $\phi$1' buses 77 and 93 are energized by clock pulses which are identically timed so that each pair of buried and surface electrodes 91 and 79 function as if they were tied together at one end.

A second set of buried storage electrodes 69 extends from the $\phi$2' bus 71, each such buried electrode being overlapped at its opposite long edges by a pair of transfer electrodes 79 and 59.

Figure 7:
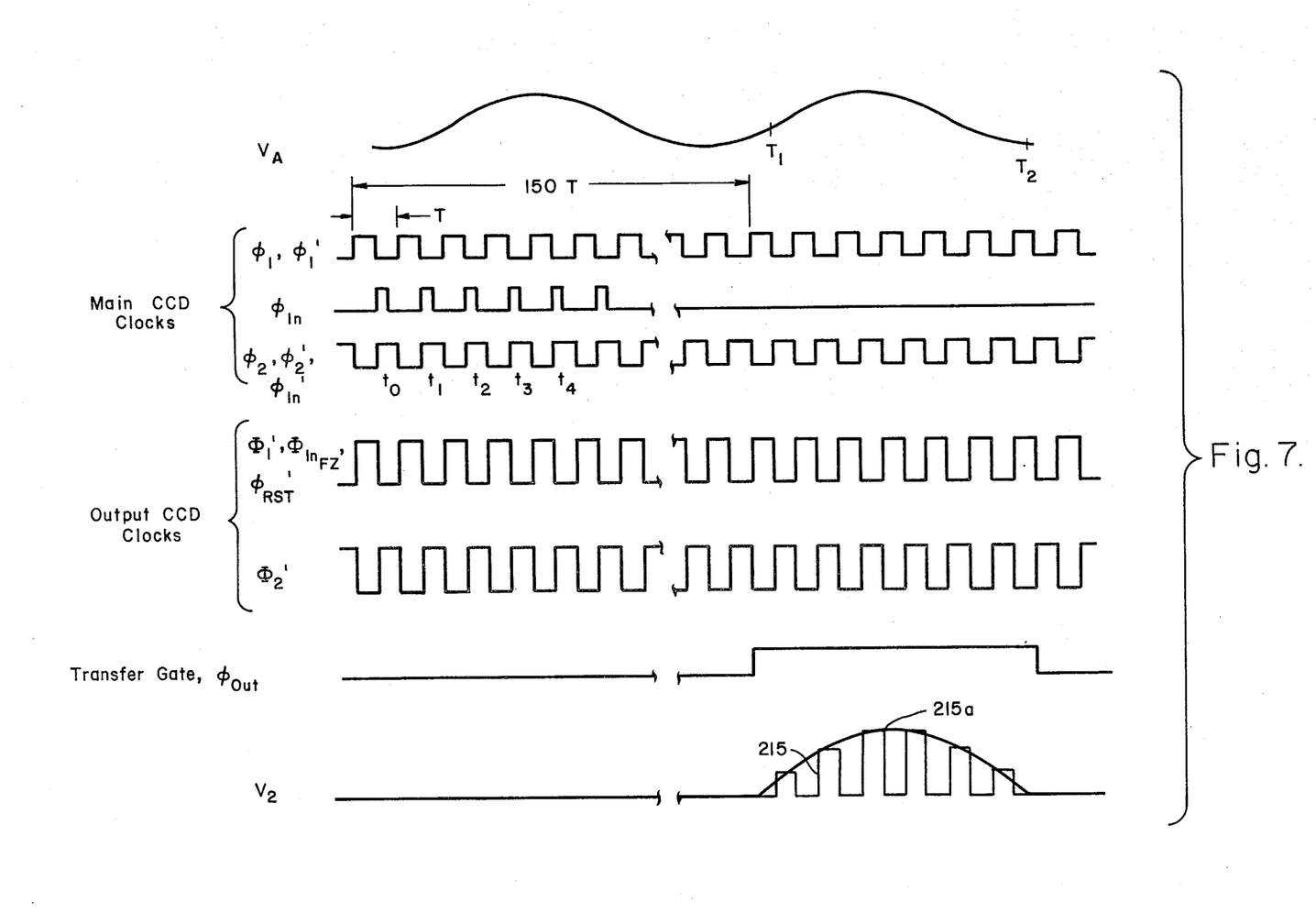
FIG. 7 is a timing diagram for the voltages indicated in the schematic and layout diagrams of FIGS. 3 and 4.

The manner in which the applied clock voltages, which are better shown in FIG. 7, cause a charge packet to be stepped along the channel 12 by means of the electrodes just described is fully described in co-pending patent application, Ser. No. 436,587, filed by John M. Hartman and Darrell M. Erb on Jan. 25, 1974 and assigned to the assignee of this application and will not be further described here.

Within the input/output station 43, the geometric configuration of the electrodes and the leads supplying them changes from that heretofore described. $\phi 2'$ clock pulses are carried from the $\phi 2'$ bus 71 over a connecting surface metal member 75 to a relatively short buried bus line 72 to which contact is made from the connecting member 75 at elongated contact 73. From the buried $\phi 2'$ bus member 72 a series of buried $\phi 2'$ electrodes 69 extend into the input/output station 41. Alternating with the buried $\phi 2'$ electrodes 69 within the station 43 are a series of buried $\phi 1'$ electrodes 103, whose upper ends make electrical contact through a series of connections 101 with a short $\phi 1'$ bus 99, one end of which makes electrical contact through a contacting member 97 with extension 95 of the $\phi 1'$ bus line 93.

The $\phi 2$ transfer electrodes 59 in the input/output station 43 extend from a slightly upwardly displaced extension 61a of the main $\phi 2'$ bus 61. Alternating with the $\phi 2$ transfer electrodes 59 within the input/output station 43 are a set of $\phi 1$ transfer electrodes 89. These are connected to a short $\phi 1$ bus 87 extending along the top of the input/output station 43. The connections between the electrodes 89 and the bus 87 are established by a series of highly doped, conductive links 83 formed between respective ones of the electrodes 89 and the bus 87 in the surface of the silicon substrate. These links make contact at their opposite ends with the electrodes 89 and the bus 87 through contact members 81 and 85 which extend from the surface metal members, (e.g. the electrodes 89 and the bus 87) down through the oxide over the surface of the silicon, to the diffused jumpers.

In the auxiliary channel 24, separate short buses are provided for applying clock pulses to the various storage and transfer electrodes therein. $\phi 1$ and $\phi 2$ clock pulses are applied over bus lines 121 and 65 to alternate sets of transfer electrodes 115 and 105 respectively. The electrodes 105 extend directly from the bus 65. On the other hand, the alternate set of surface electrodes 115 are connected to the $\phi 1$ bus 121 through a set of doped links 119 in the surface on the silicon substrate in the same manner as described previously with reference to the transfer electrodes 89 of the main channel of the input/output station 43.

A second set of bus lines 124 and 110 carry the $\phi 1'$ and $\phi 2'$ clock pulses to two sets of alternating storage electrodes 123 and 109 respectively. The $\phi 1$ and $\phi 2$ clock signals which are applied to the bus lines 121 and 65 are the same as those shown applied to the bus lines 77 and 61 in the main channel. The significance of applying the separate labels $\phi 1'$ and $\phi 2'$ to the clock signals being applied to the buried electrode bus lines 124 and 110 is that, although the clock signals are timed to coincide with the clock signals $\phi 1'$ and $\phi 2'$ which are being applied to the storage electrodes in the main channel portion 12, their magnitudes are different so as to create potential well in the output channel 14 which are deeper than those created in the main channel 12, as will be explained in greater detail with reference to FIG. 5.

Beyond the end of the transfer electrode 29, but still within the input/output station 43, three transfer electrodes 63, 117 and 108 extend across both channels 12 and 14. They are respectively supplied with $\phi 2$, $\phi 1$ and $\phi 2$ clock pulses from the bus lines 65, 121 and 65. Associated with the respective transfer electrodes 63, 117 and 108, are three similarly long storage electrodes 111, 125 and 113, each of which also spans both of the channels 12 and 14. The "long" storage electrodes 111, 125 and 113 respectively receive clock pulses from the bus lines 110, 124 and 110.

When charge is not being read out from the main channel 14, background charge packets are periodically injected and stepped through the output channel 14. Toward this end, an input diffusion 131 is provided at the input end of the output channel 14 to which a D.C. voltage level labeled $V_{FZ}$ is applied through line 133. Overlapping the diffusion 131 and the first $\phi 1'$ storage electrode 123 is an input electrode 137, which is supplied with a clock voltage $\phi_{INFZ}$ through line 139. It may be seen that, through the modulation of the input electrode 137, the amount of charge injected through the input diffusion 131 under the influence of the D.C. voltage $V_{FZ}$ is modulated so as to cause a charge to be injected at the clocking rate into the output channel 12. As these charges are stepped along the output channel they may, in the absence of a transfer of charge from the main channel 14, reach the opposite end of the output channel and be read out unchanged. Alternatively, when a readout of charge is desired, the fixed or background charge normally stepped along the output channel is modulated or modified by the amount of the charge which is transferred through the transfer ports 27.

Charge reaching the output end of the output channel 14 is picked up and amplified in essentially the same manner as described in the above-referenced Hartman-Erb patent application, Ser. No. 436,587 and will not be described in detail here. Basically, signals are sensed by a pair of spaced apart output diffusions 143 and 144. Diffusion 143 is itself spaced from the last buried electrode 113, being coupled thereto by a screen electrode 145 held at a D.C. reference level $V_{SC}$ from a source 150. A transfer electrode structure comprised of a buried electrode 149 and a surface electrode 147 couples the first diffusion 143 to the second diffusion 144. The surface electrode 147 receives a D.C. potential $\phi_{RST}$ from a potential source 152, while the buried electrode 149 receives a clocking signal $\phi'_{RST}$ from a clock source 154. The second diffusion 144 is held at a D.C. level $V_{DD}$ by a biasing source 151.

Signals sensed at the diffusion 143 are amplified by a MOSFET device 153 located in the chamber 55 and comprised of a pair of spaced apart diffusions 155 and 157 serving as the source and drain of the device.

A surface metal gate 156 between the source and drain, serves as the input electrode of the device, receiving signals through a surface metal connection 158 from the output diffusion 143. The output circuit of the MOSFET device 153 is completed by connections to sources of D.C. potentials V1 and V2 159 and 161, with the signal output of the device being derived from the connection to the V2 source 161.

The output circuit differs from that described in the above-referenced Hartman-Erb application in that, in the latter, both the drain 144 and the drain of MOSFET 153 are supplied from a common bias source $V_{DD}$, and a single output electrode 149 spans the source and drain 143 and 144. The separation of biases is not significant and a single bias could be used here also. The separation of the output reset electrode structure into two members in the embodiment illustrated herein is in order to provide a tetrode structure in which the source 143 is electrostatically shielded by electrode $\phi_{RST}$ from the reset signal on the $\phi'_{RST}$ electrode.

Turning next to the structural features of the input station of the exemplary device illustrated in detail in FIG. 3, it will be recalled that it is comprised essentially of a forked junction, the bottom branch of which is a part of the main channel 12 and the top branch of which communicates with the input chamber 47. Charges, which have been stepped along the main channel, past the series of transfer ports 27, reach the forked junction via the top end of the "long" transfer electrode 108 and its associated storage electrode 113, which extend both over the output channel 14 and the main channel 12. Thus, the last position in which a charge packet resides prior to being thrust into the read in station 17, is in the storage well which is maintained under the storage electrode 113, in the main channel 12. Subsequent electrode structures progressing toward the left in FIG. 3 from the electrodes 108 and 113, extend over the entire breadth of the forked junction in the input station 17. They include $\phi$1 transfer electrodes 167 extending upward from the $\phi$1 bus line 77, $\phi$1' storage electrodes 169 extending upward from the $\phi$1' bus 93, $\phi$2 transfer electrodes 171 extending downward from a portion of the $\phi$2 bus 61, and $\phi$2' storage electrodes 173 extending downward from an extension of the $\phi$2' bus line 71.

Charges to be read in are injected through an input diffusion 175 which is in the input chamber 47 and which is maintained at a potential $V_A$ from a source 179 through a lead 177. Extending directly across the inlet from the chamber 47 to the extension of the channel 12 is storage electrode 187 which is spaced from, and parallel to, the input diffusion. Overlapping the interfacing edges of the input storage electrode 187 and the input diffusion 175 is an input transfer electrode 181. The input transfer and storage electrodes 181 and 187 are respectively supplied with clocking voltage $\phi_{IN}$ and $\phi'_{IN}$ from sources 185 and 191 over lines 183 and 189. The input configuration is essentially the same as that disclosed in FIG. 5 of the above referenced Hartman/Erb application, Ser. No. 436,587, the only difference being, that rather than maintaining the input electrode structures 187, 181 at a constant potential, they are instead clocked in the manner shown in FIG. 7. In this way an analog signal $V_A$ is transformed by periodic sampling into a series of charge packets whose magnitudes correspond to the magnitude of the analog signal $V_A$ at the respective sampling instants. $\phi_{IN}$ turns off before $\phi'_{IN}$, so as to provide isolation of the sampled charge from diffusion 175 when $\phi'_N$ turns off. This way the charge is cut off from its source (diffusion 175) and can go only into the main channel by attraction from the main channel clocks.

Let it be assumed now that, at time $t_0$ the analog input signal $V_A$ is to be sampled. As a result, a charge packet will be injected at time $t_0$ through the input diffusion 175 under the control of the clocking voltages $\phi_{IN}$ and $\phi'_{IN}$, with the injected charge packet becoming storaged temporarily at the storage site under the input storage electrode 187 located across the inlet port of the input chamber 47. It might be noted that at the same time a residual charge will have been transferred to the storage site maintained under the storage electrode 169 in the main channel 12, which in FIG. 3 will be seen to be just opposite the input storage electrode 187. When the charge packet which was just injected, has been stepped through the input station, it will have been absorbed into, and combined with, that particular collection or residual charge, which at the time of its original injection, was stored under the storage electrode 169, as just described. In other words, the residual charge which is being stepped along the main channel 12, and the injected charge packet resulting from the sampling of the input analog signal $V_A$, will be stepped along, side by side in tandem, thereby permitting the gradual transfer of the injected charge into the main channel, with the successive advancements of the residual and injected charges during successive clock periods.

Figure 6:
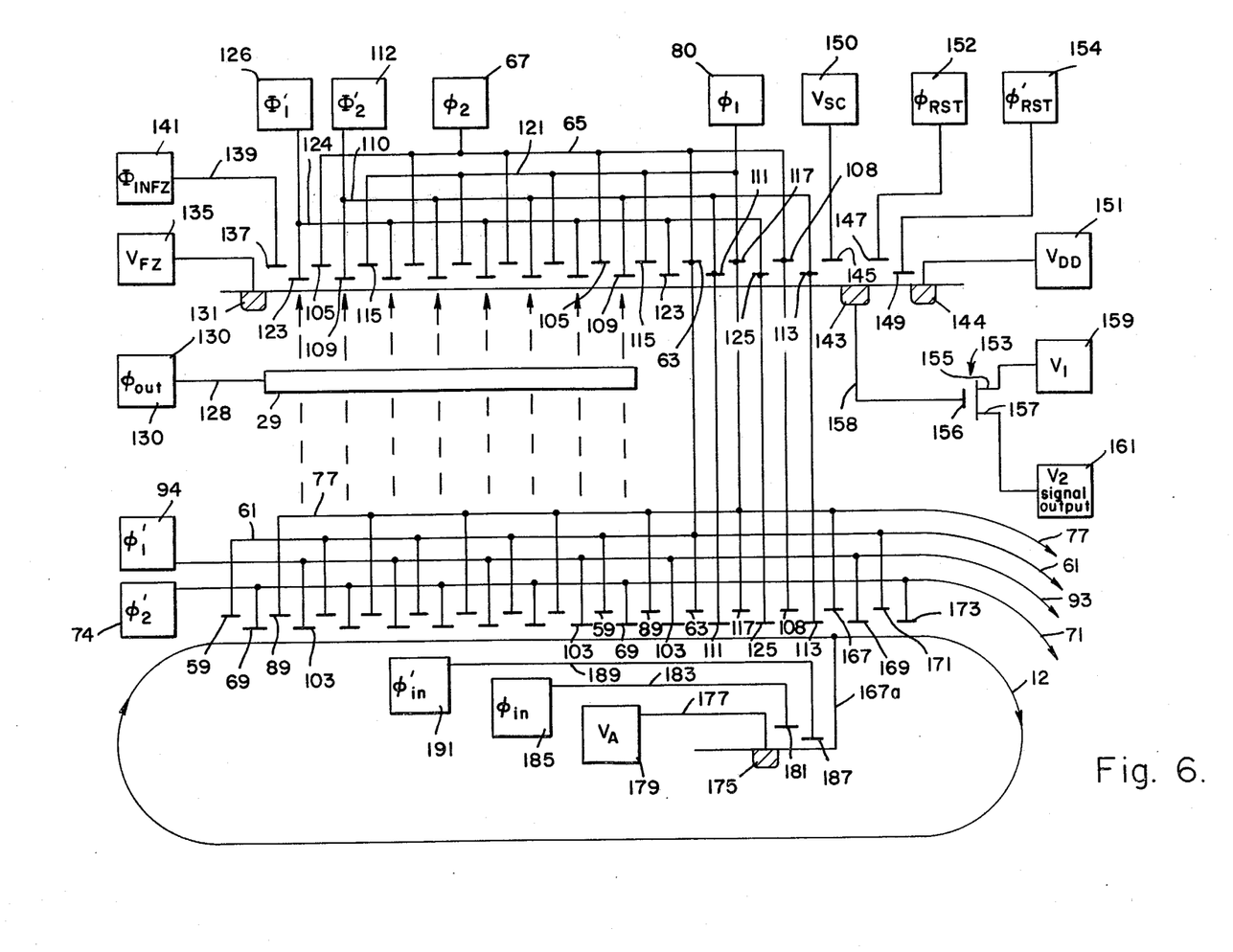
FIG. 6 is a schematic diagram of the system illustrated in FIG. 2.

Thus, during the time period $t_1$ following the initial injection of the input signal, the injected charge packet will be stepped forward by means of the first transfer electrode 167 of the input station, to become temporarily stored under the first storage electrode 169 of that input station. This is represented in the schematic diagram of FIG. 6 by the line 167a leading from under the storage input electrode 187 to the representation of the main channel 12 under the transfer electrode 167. Thus, the line 167a in FIG. 6 represents that portion of the transfer electrode 167 which extends across the inlet port leading from the input chamber 47 to the upper branch of the forked input station. During subsequent time periods $t_2$, $t_3$, etc, the injected charge packet will be stepped forward to be temporarily stored under successive ones of the $\phi$1' and $\phi$2' electrode members in the read in station 17. The injected charge may not fully reach the main channel 12 until, at time $t_9$, it has been stepped into the last of the storage electrodes 169 shown in FIG. 3. Thus, in the exemplary system illustrated, it is seen that the injected charge will have had nine times as long to enter the main channel 12 as it would have had, had it been injected directly through an opening at right angles to the charge flow in the main channel in the manner illustrated, for example, in FIG. 8 of the aforementioned Hartman/Erb patent application.

Figure 4:
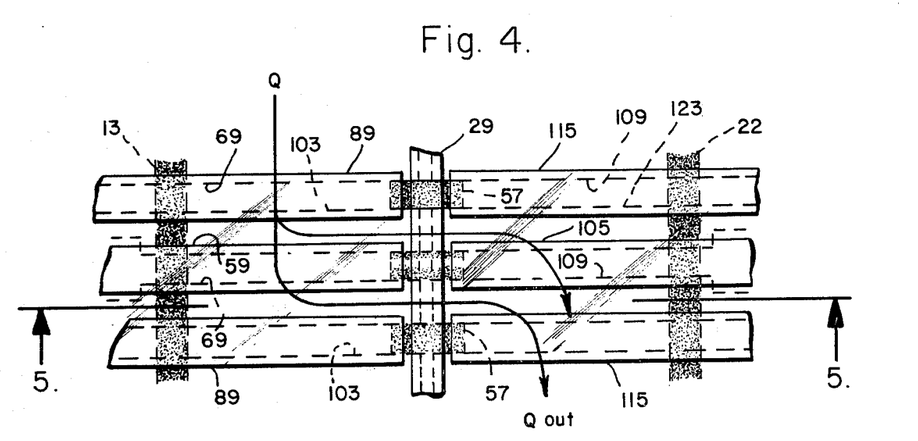
FIG. 4 is a further magnified portion of the junction between the main track of the racetrack CCD and the output track, to illustrate the manner in which charge is transferred from one to the other.
Figure 5:
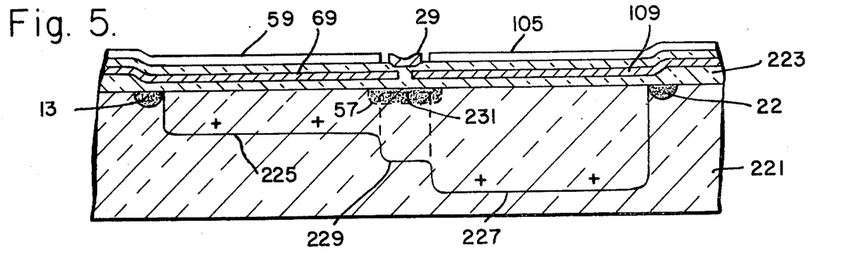
FIG. 5 is a cross-section through FIG. 4 along lines 5—5, showing the descending stair configuration of the potential under the racetrack CCD and the output ramp for effecting transfer from the former to the latter.

The manner in which charge is read out of the main channel is quite similar to that just explained for the read in operation and will be understood best by reference to FIGS. 4 and 5. FIG. 4 shows the flow of charge during readout from the main channel 12 to the output channel 14, and FIG. 5 illustrates the configuration of the depletion regions under a pair of storage electrodes 69 and 109 in the respective channels to bring about the flow of charge from the former to the latter. Thus, the transfer of charge from under a given storage electrode 69 to the substrate under its associated storage electrode 109 is promoted by maintaining the $\phi$1' clock voltage on the storage electrode 109 higher than the $\phi$1' clock voltage on the main channel storage electrode 69, making the depletion regions 227 under the output channel storage electrodes 109 deeper than the depletion regions 225 under the main channel storage electrodes 69.

In order to cut off charge flow through transfer ports 27, when readout is not desired, gating means in the form of electrode 29 are provided. During readout the gate voltage $\phi_{OUT}$ is maintained at such a D.C. voltage level as to keep the depletion region 229 under the transfer electrode 229 at a level which is between those of the depletion regions 225 and 227 in the main and output channels. When readout is not desired, the output gating voltage $\phi_{OUT}$ is dropped to a lower absolute level, as seen in FIG. 7, thereby diminishing the depth of the depletion region under the transfer gate 29 to a level 231. This creates a potential barrier across the transfer ports 27 and will confine the charge packets in the main channel 12. The transfer of a given charge packet will occur over eight clock periods, this representing the time it will take the charge packet to be stepped past the eight transfer ports 27. During the next five clock periods the charge packet thus transferred in full to the output channel 14 is stepped toward the output diffusion 143 by transfer electrodes 115, 63, 117, 108 and by the screen electrode 145. An output signal proportional to the size of the transfer charge packet is produced, as mentioned previously in the output circuit 161 connected to the drain of the output MOSFET 153.

At the top of FIG. 7 is shown a sinusoidal signal $V_A$, which may be sampled and read into the CCD 11 just described. At the bottom of FIG. 7 are shown a series of pulses 215, which would appear as the signal output at $V_2$ circuit 161 if the signals being read out represented the charges which have been sampled between $T_1$ and $T_2$. It is seen that the envelope 215a of the pulses 215 conforms faithfully to the shape of the input signal $V_A$.

Figure 10A:
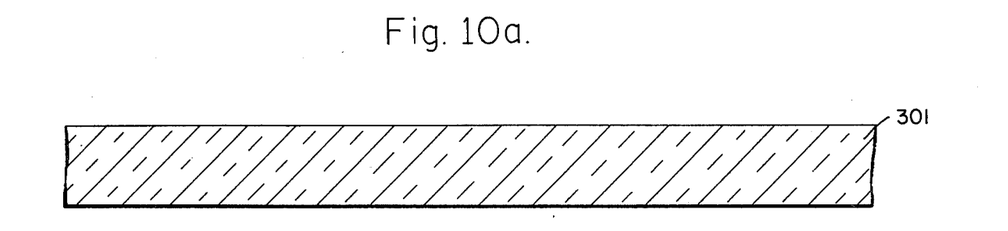
FIGS. 10a–10l are a series of cross sections illustrating the sequence of steps for fabricating devices of the type illustrated in FIGS. 1-9.
Figure 10B:
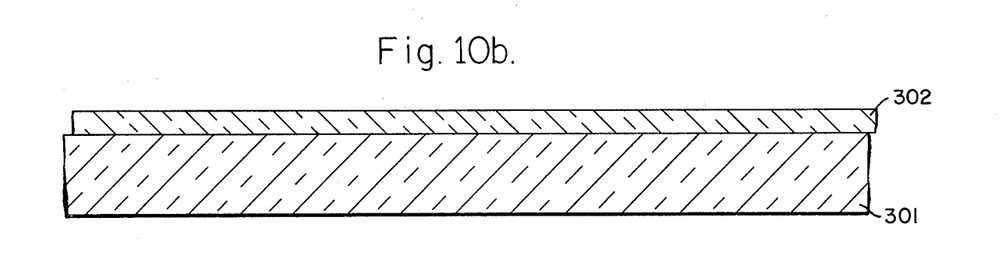
Figure 10C:
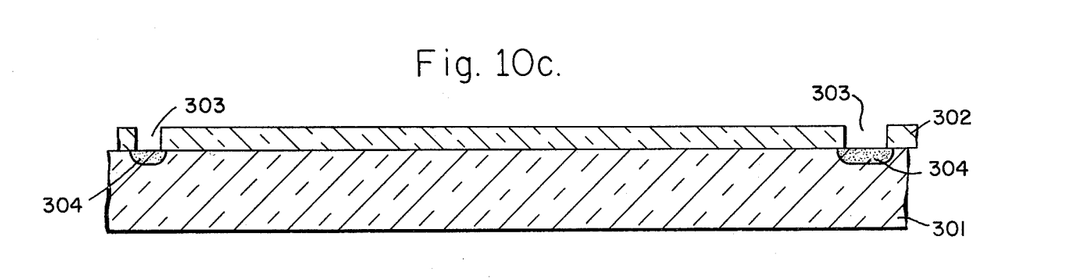
Figure 10D:
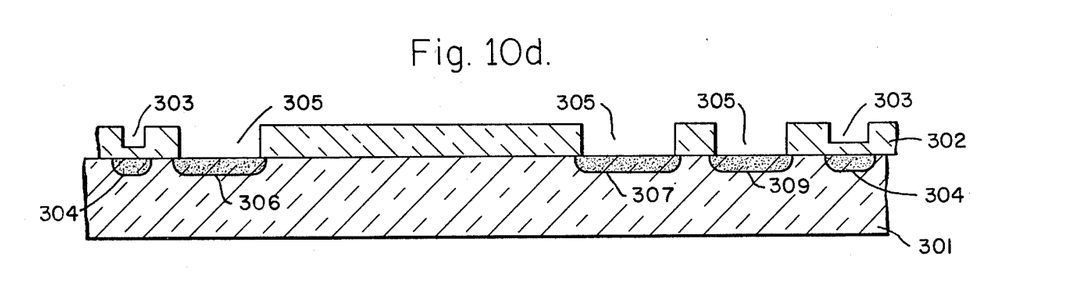

FIGS. 10a–10l illustrate a series of steps which may be followed to fabricate the exemplary integrated circuit illustrated herein. The circuit is formed in an N-type silicon substrate 301 having a resistivity of 2 to 3 ohm centimeters (FIG. 10a). A layer of oxide 302 approximately 1 micrometer in thickness is thermally grown on the substrate 301 (FIG. 10b). By use of a photoresist mask, windows 303 are selectively etched through the oxide layer 302 and through these windows N+ dopant is diffused to form channel stops 304 which correspond to the channel stops 13 and 22 for defining the charge-carrying channels (FIG. 10c). The substrate is further subjected to an oxidizing environment so as to re-form the oxide layer over the doped regions 304. Additional openings 305 are then formed in the layer 302 by the selective etching process. Through the openings 305 a P+ dopant is diffused to form injecting and collecting regions 306 and 307 and drain region 309. The region 307, in addition to serving as the collecting region for the CCD, also serves as the source of the MOSFET device whose drain is constituted by the region 309 (FIG. 10d).

Figure 10E:
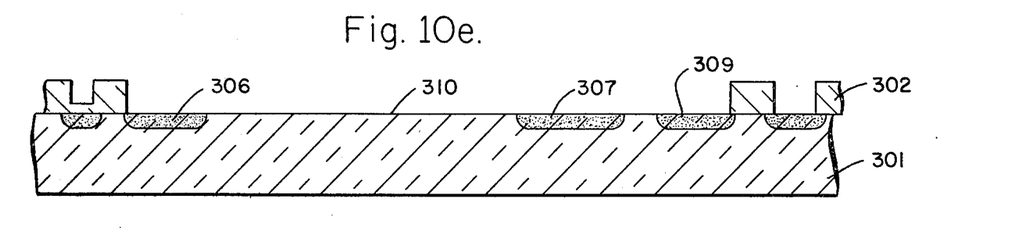
Figure 10F:
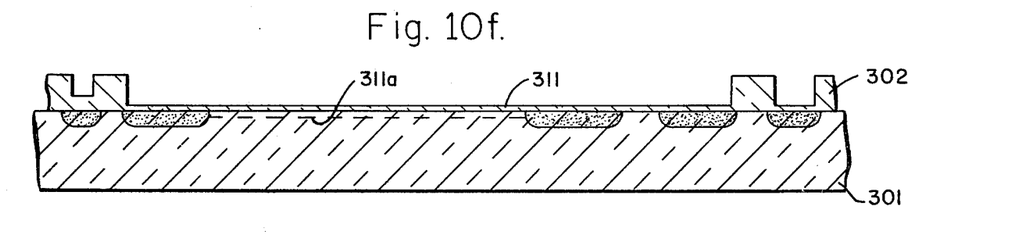
Figure 10G:
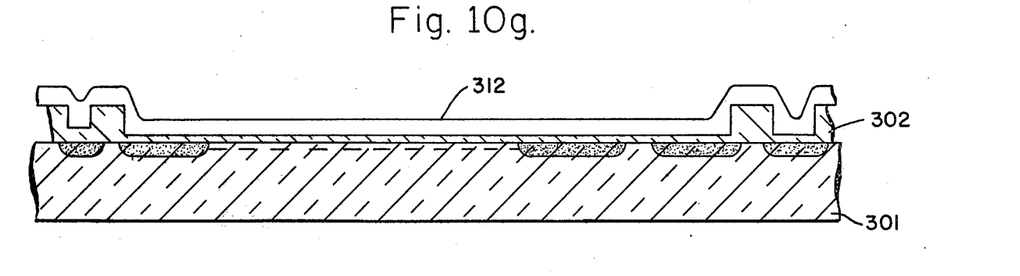

By use of an additional mask which defines the area over which a thin oxide is to be grown, the previously formed oxide layer 302 is removed selectively from that area (FIG. 10e). The thin oxide layer 311 is thermally grown to a thickness of approximately 1000 Å (FIG. 10f). Optionally, after growth of the thin oxide layer 311, the substrate surface may be implanted in the area of 311a to create buried channels for the CCD device. The advantage of buried channel CCDs over surface channel CCDs are explained in Krambeck U.S. Pat. No. 3,739,240 as well as in an article entitled, "An Overlapping-Electrode Buried Channel CCD", by Erb, Kotyczka, Su, Wang, and Clough, published in Proceedings of the International Electron Device Meetings, Washington, D.C., December, 1973, pgs. 24–26. In the referenced article a buried channel CCD is described in some detail along with experimental results obtained therewith. Suffice it to say here that the principal advantages of using the buried channel CCD construction are transfer efficiency and elimination of the requirement to work with an artificially high ambient charge level commonly referred to as a "fat zero".

Figure 10H:
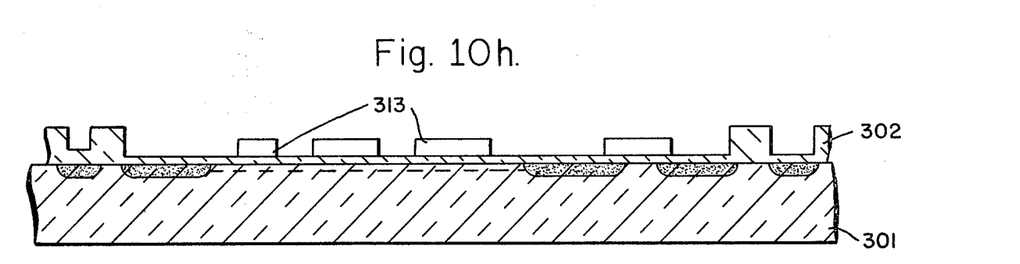
Figure 10I:
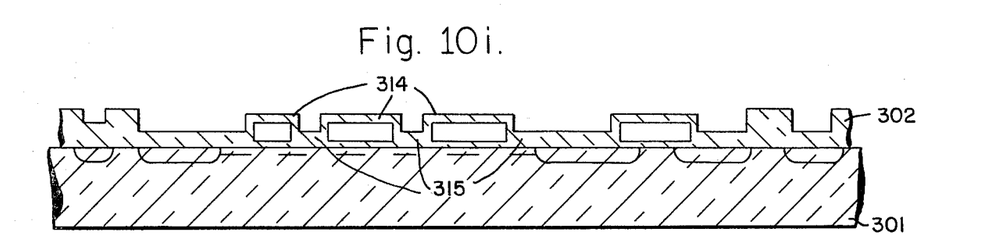
Figure 10J:
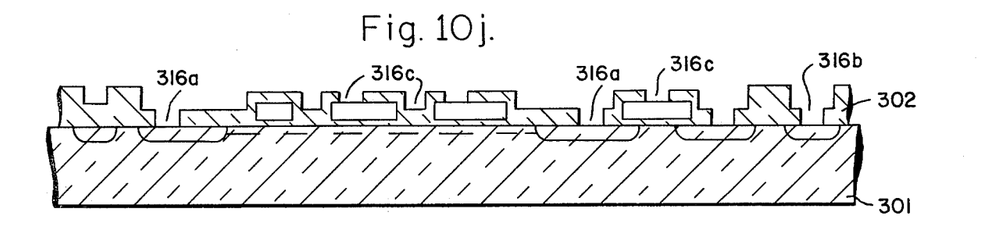
Figure 10K:
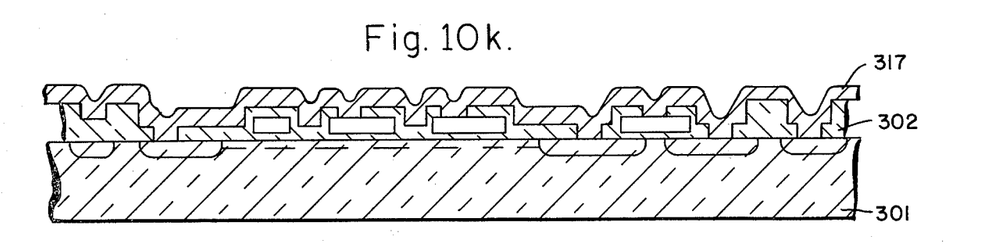

A layer of polycrystalline silicon 312, approximately 5000 Å thick, is next deposited over the oxide layers 302 and 311 (FIG. 10g) and is selectively etched to form the silicon electrode portions 313 (FIG. 10h). The polycrystalline silicon electrodes 313 are then oxidized to form a passivating oxide layer approximately 1500 Å thick. At the same time, the oxide layer over the channel regions, which are to be covered by aluminum electrodes, is thickened to about approximately 2000 Å. (FIG. 10i) The next step is to open the contact holes over the regions which are to be contacted by the aluminum layer 317 which is subsequently formed. Thus, contact holes 316a lead to the P+ regions, 316b leads to the N+ channel stopper regions, and 316c serve to provide contact to the polycrystalline silicon electrodes 313 (FIG. 10j).

Figure 10L:
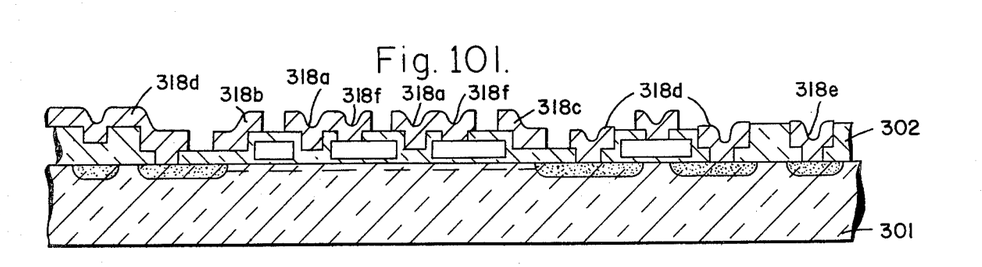

An aluminum layer 317, approximately 10000 Å thick, is then deposited (FIG. 10k) and etched (FIG. 10l) to form CCD surface electrodes 318a, input screen electrode 318b, output screen electrode 318c, connections 318d to P+ regions, connections 318e to N+ channel stopper regions 304, and to polycrystalline silicon electrode connections 318f. It might be noted that in the detailed description of the exemplary embodiment illustrated in FIG. 3, the surface electrode members and the buried electrode members are not shown connected to one another. This is preferred usually where maximum flexibility in the application of clock voltages to those electrode members is desired. However, in production, it is sometimes preferred to make an electrical connection between respective surface and buried electrode pairs which, of course, mandates that the identical clock voltage be applied to both. This results in reduced flexibility but also in reduced fabricating complexity and is, therefore, preferred in production. It is this production embodiment whose fabrication is illustrated in FIG. 10l in which the surface electrode members are shown electrically connected to their respective associated polycrystalline silicon buried electrode members.

Figure 8:
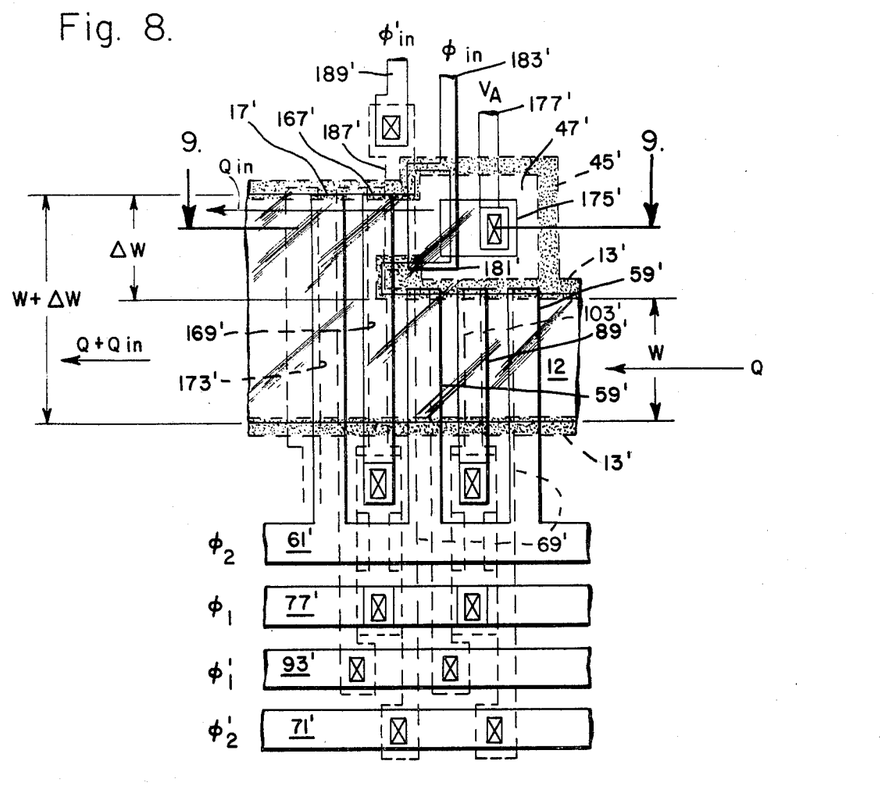
FIG. 8 is a plan view of an alternative input ramp which insures that the track into which charge is injected is sufficiently wide to accommodate the additional injected charge.

Having described in some detail one embodiment of a readout station and two embodiments of a read in station with particular reference to FIGS. 3 and 8, there will next be explained the broader inventive concept underlying the readout and read in devices shown. Thus, it will be demonstrated that the readout station is a special case of charge merging performed in accordance with the broader aspects of the present invention.

Basically the present invention involves two types of operation: the splitting of charge from a main channel to that channel and one or more auxiliary channels and the merging of charge from two or more sources into a main channel. Each of these two operations of splitting and merging may be effected either with or without control over the proportion of charge which is split or merged. The two basic alternatives for splitting charge are schematically illustrated in FIGS. 12 and 14.

Figure 14:
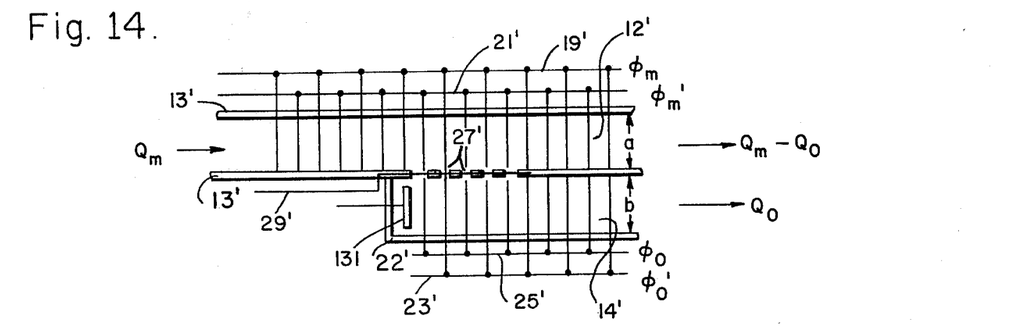
FIG. 14 shows a charge splitting junction in which all or a desired portion of charge being stepped along a main channel may be split off into an auxiliary charge carrying channel.

The circuit shown in FIG. 14 is quite similar to the readout station illustrated generally in FIG. 1 and specifically in FIG. 3, except that means are not shown in FIG. 14 for reading the charge out from the auxiliary channel 14'. Elements in FIG. 14 are identified by the same reference numerals as those used to identify their counterparts in FIG. 1, but with a "'" added. The ratio of the charge $Q_O$, which is split into the auxiliary channel 14' and the charge $Q_m$ approaching the openings 27 in the main channel 12, is a function of the relative widths "a" and "b" of the main and auxiliary channels 12' and 14' and of the potentials maintained by the respective electrode structures over the main and auxiliary channels. Thus, not only can the splitting of charge from the main channel 12' to the auxiliary channel 14' be totally cut off by the application of an appropriate voltage to the control electrode 29', but the fraction of the charge split from channel 12' to channel 14' can also be varied as desired.

Assume, however, that it is not desired to be able to vary the proportion of the charge split. In that case, it is sufficient to use the embodiment illustrated in FIG. 12 in which the main channel 12' communicates with the auxiliary channel 14' through a single opening 27' spanned by electrodes 233 and 235 respectively clocked by $\phi$ and $\phi'$ clock pulses. There is no need for a plurality of openings 27', such as those shown in FIG. 14. The need for a plurality of such openings arose only because, with the FIG. 14 embodiment, it was necessary to have electrically separate electrodes over the main and auxiliary channels 12' and 14' so as to permit the surface potential of one to be varied relative to the other. With separate electrodes, there was a need to provide separate paths from each electrode in the main channel 12' to its associated electrode in the auxiliary channel 14' in order that charge might flow from one to the other without interference from the charge on adjacent electrodes. The further provision of the transfer electrode 29 was seen to be for the purpose of cutting off completely the flow of charge through the transfer port 27.

Figure 12:
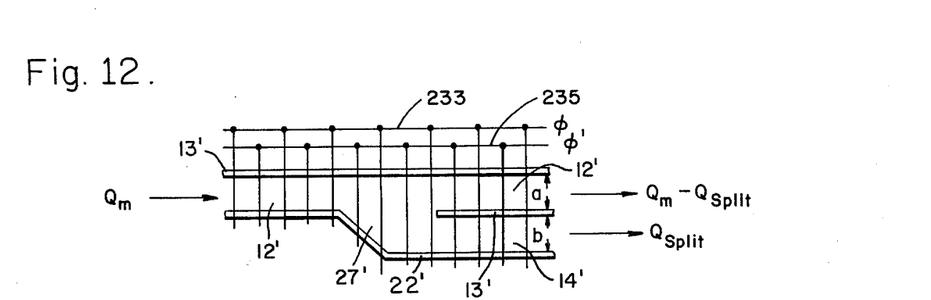
FIG. 12 illustrates a splitting junction, similar to the merging junction of FIG. 11, for separating a single charge stream into two parts whose relative magnitudes are fixed.

Thus, where it is satisfactory if the proportion of split charge to main channel charge is fixed and there is no need to be able to cut off the flow of charge from the main channel to the auxiliary channel, the configuration of FIG. 12 is sufficient. Since there is no need to be able to create a surface potential gradient from main to auxiliary channel, integral electrodes extending across both channels are sufficient; and with integral electrodes, there is no need for separate openings.

In the FIG. 12 embodiment charge being stepped along the main channel 12' by the clocked electrodes 233 and 235 flows along those electrodes into the auxiliary channel 14' as the charge is being stepped past the opening 27'. The ratio of the charge split into channel 14' to the charge $Q_m$ prior to splitting is determined by the relative widths of the auxiliary channel 14' and the main channel 12' downstream of the opening 27' in the manner indicated by the equation which is a part of FIG. 12.

Figure 11:
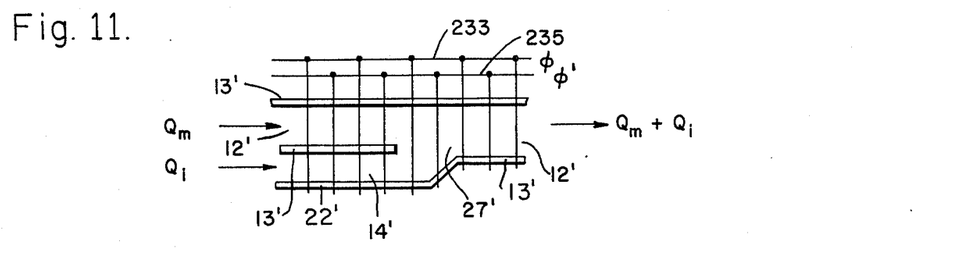
FIG. 11 illustrates schematically a merging junction for combining the charge flowing in two channels into a single charge stream.

Similarly, merging can be effected by two configurations which are almost identical to those illustrated in FIGS. 12' and 14'. Where it is sufficient to have a fixed ratio of charge in the main and auxiliary channels, the configuration of FIG. 11 is used. The FIG. 11 configuration is identical to that shown in FIG. 12 except that the direction of charge flow is reversed. Consequently, identical reference numerals are used in FIG. 11 to designate the elements which correspond to similar elements in FIG. 12. The read in station 17 of FIG. 1 and FIG. 3 is but a special case of the FIG. 11 merging junction. The auxiliary channel 14 of FIG. 11 is, however, foreshortened in FIG. 3, being shown merely as an enlarged portion of the main channel 12 and terminating in the input chamber 47. Conversely, ignoring for sake of example of the presence of the electrodes situated to the right of the input chamber 47, if the rear wall of the input chamber 47 in FIG. 3 were removed and the upper wall were extended, parallel to the main channel stopper 13, the resulting configuration would be seen to correspond to that shown in FIG. 11. In other words, a charge merging junction in accordance with the present invention may be used, as in FIG. 3, to read charge into a channel from an input diffusion which is located next to the main channel and which is in communication with that main channel through an abbreviated or foreshortened auxiliary channel which leads into the main channel through an opening in the wall of that channel. Or, alternatively, the merging junction may be used as in FIG. 11, to merge charge from an auxiliary channel through such an opening into a main channel.

Figure 13:
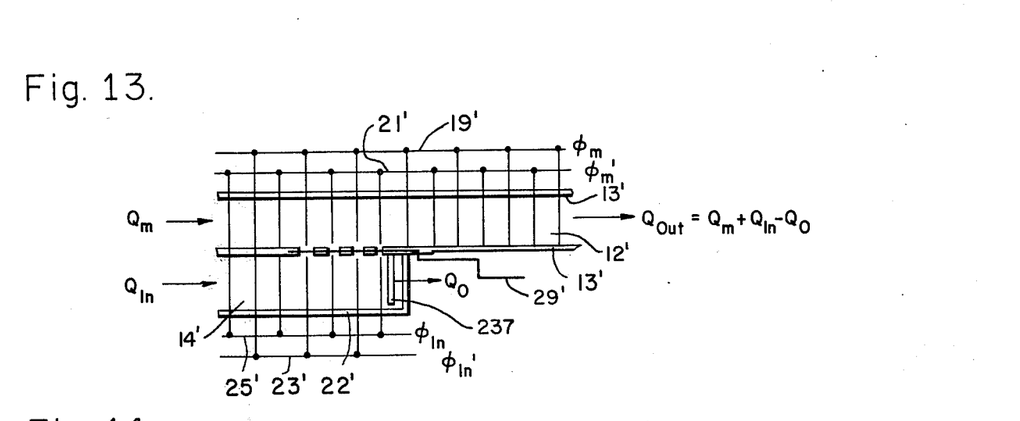
FIG. 13 is a charge merging junction whereby charges in two separate channels may be combined selectively into a single charge stream.

As an alternative to the single opening configuration of the merging junction shown in FIG. 11, the multiport configuration shown in FIG. 13 may also be used, particularly where it is desired to have greater control over the charge which is merged from the auxiliary channel 14' into the main channel 12'. Physically, the merging junction of FIG. 13 is almost identical to the splitting junction of FIG. 14. They differ only in that charge flows in the merging junction of FIG. 13 in a direction opposite to that of the charge flow in the splitting junction of FIG. 14 and in that in place of the electrode 131 in FIG. 14, which serves to inject background charges (also called "fat zero"), an electrode structure 237 is provided in the auxiliary channel 14' of FIG. 13 for taking out charges from the auxiliary channel 14 which are not being transferred through the transfer ports 27' into the main channel 12'.

From the above, it is apparent that by means of the present invention there has been contributed to the art of fabricating charge coupled devices, a technique for effecting the transfer of charge into or out of a channel by means of merging and splitting junctions which, by permitting the charge transfer to take place gradually while the charge travels along a channel, permits transfer to take place at a higher clock rate than would otherwise be possible.

What is claimed is:

1. In a charge-coupled device having a first linear array of electrode structures distributed over the surface of a semiconducting substrate to define, when energized, a first series of charge storage sites therein, means within said substrate defining a first charge-carrying channel within which said storage sites are distributed, and means for applying clocking signals to said electrode structures so as to step charge packets within said channel between successive ones of said storage sites, an improved readout station comprising:

(a) a second linear array of electrode structures distributed over the surface of said semiconductor substrate so as to define, when energized, a second series of charge storage sites, and means within said substrate defining a second charge carrying channel within which said second series of charge storage sites are distributed, said first and second linear arrays of electrode structures each including a series of spaced apart storage electrode members, each storage electrode member of said second series being aligned end to end with a corresponding storage electrode member of said first array;

(b) means for establishing individual connecting channels in said substrate between said first and second channels from respective ones of said first series of storage sites to corresponding ones of said second series of storage sites, said means for establishing individual connecting channels comprising a series of doped partitions extending in said substrate from between a pair of adjacent storage electrode members in said first array of electrode structures to between a pair of adjacent storage electrode members in said second array of electrode structures;

(c) means for selectively establishing a depletion region gradient from respective ones of said first series of storage sites to corresponding ones of said second series of storage sites, such that charge flows from charge packets in the former to create output charge packets in the latter, said means for establishing a depletion region gradient including:
  (1) a transfer electrode member which extends between the ends of respective pairs of aligned storage electrode members; and
  (2) means for applying a voltage to said transfer electrode member between the ends of said aligned storage electrode members, the depth of the depletion region under said transfer electrode member being intermediate the depths of the depletion regions under respective members of said pairs of aligned electrodes; and (d) means for applying clocking signals to said second array of electrode structures so as to step the output charge packets received in their associated storage sites in synchronism with the master charge packets from which they were derived, at such a rate as to cause continuing and cumulative transfer of charge from given charge packets in said first series of charge storage sites to their associated output charge packets in said second series of charge storage sites as the respective charge packet pairs pass through successive individually interconnected storage site pairs.

* * * * *